United States Patent [19]
Kawasaki et al.

[11] Patent Number: 5,339,457
[45] Date of Patent: Aug. 16, 1994

[54] SUPERCONDUCTIVE ELECTROMAGNETIC WAVE MIXER AND SUPERCONDUCTIVE ELECTROMAGNETIC WAVE MIXING APPARATUS EMPLOYING THE SAME

[75] Inventors: Takehiko Kawasaki; Katsuhiko Shinjo; Keisuke Yamamoto; Norio Kaneko, all of Atsugi, Japan

[73] Assignee: Canon Kabushiki Kaisha, Tokyo, Japan

[21] Appl. No.: 829,556

[22] Filed: Feb. 5, 1992

Related U.S. Application Data

[63] Continuation of Ser. No. 679,833, Apr. 1, 1991, abandoned, which is a continuation of Ser. No. 444,441, Dec. 1, 1989, abandoned.

[30] Foreign Application Priority Data

| Dec. 9, 1988 | [JP] | Japan | 63-310085 |
| Oct. 24, 1989 | [JP] | Japan | 1-274924 |
| Oct. 24, 1989 | [JP] | Japan | 1-274925 |
| Oct. 24, 1989 | [JP] | Japan | 1-274926 |
| Nov. 24, 1989 | [JP] | Japan | 1-304581 |

[51] Int. Cl.$^5$ ............................... H04B 1/28
[52] U.S. Cl. ........................ 455/333; 505/853; 505/866; 505/875; 331/107 S
[58] Field of Search .............. 455/325, 333, 326–328, 455/330; 333/219, 227–229, 230–233, 235, 248, 99 S; 357/5; 505/853, 865, 866, 875; 331/107 S

[56] References Cited

U.S. PATENT DOCUMENTS

| 3,970,965 | 7/1976 | Shapiro et al. | 455/325 |
| 4,298,990 | 11/1981 | Bielska-Lewandowska | 505/866 |
| 4,499,441 | 2/1985 | Lynch et al. | 505/866 |
| 4,610,032 | 9/1986 | Miller et al. | 455/325 |

FOREIGN PATENT DOCUMENTS

| 0325765 | 8/1989 | European Pat. Off. |
| 0342038 | 11/1989 | European Pat. Off. |
| 0134507 | 10/1980 | Japan | 455/326 |

OTHER PUBLICATIONS

Soviet Technical Physics Letters. vol. 14, No. 11 Nov. 1988, New York US pp. 845–846; Drobinin et al.: "Frequency mixing in a ceramic $YBA_2Cu_3O_x$ Josephson junction".

Nature vol. 333, No. 5, May 1988, London GB pp. 29–35; Clarke: "Small-scale analog applications of high-transition-temperature superconductore".

"Small-scale analog applications of high transition-temperature super-conductors" by John Clarke; Nature; vol. 333, May 5, 1988; pp. 29≧35.

Primary Examiner—Reinhard J. Eisenzopf
Assistant Examiner—Andrew Faile
Attorney, Agent, or Firm—Fitzpatrick, Cella, Harper & Scinto

[57] ABSTRACT

The present invention relates to a superconductive electromagnetic wave mixer comprising a local-oscillator section and a receiving section, said receiving section serving as a section at which an electromagnetic wave from the local-oscillator section and an externally originating electromagnetic wave are combined. The local-oscillator section and said receiving section are each formed by at least one Josephson junction employing at least one oxide superconductor.

20 Claims, 9 Drawing Sheets

SUPERCONDUCTIVE ELECTROMAGNETIC WAVE MIXER AND SUPERCONDUCTIVE ELECTROMAGNETIC WAVE MIXING APPARATUS EMPLOYING THE SAME

This application is a continuation of application Ser. No. 07/679,833 filed Apr. 1, 1991 now abandoned, which is a continuation of application Ser. No. 07/444,441 filed Dec. 1, 1989, now abandoned.

BACKGROUND OF THE INVENTION

1. Field of the Invention

The present invention relates to a heterodyne mixer that employs a superconductor, utilized in detecting electromagnetic waves such as millimeter waves, and an electromagnetic wave mixing apparatus that employs such a mixer.

Related Background Art

Heterodyne detectors utilized in detecting electromagnetic waves such as millimeter waves have been hitherto constituted of an antenna, a local oscillator such as a Gunn oscillator or a klystron, and a heterodyne mixer device.

As the heterodyne mixer devices, heterodyne mixer devices employing Josephson junctions comprising a metal such as Nb are used, which mixer devices have been so constituted as to have an SIS-type laminated structure so that its junctions can have capacitance.

In the conventional heterodyne detectors, however, the local oscillator and the Josephson mixer device are separately constituted from each other, and these are connected with each other using a waveguide, resulting in a very large-scale apparatus. In addition, the local oscillator is required to have an output of from 10 nW to 100 nW, also bringing about a great power dissipation.

To cope with these problems, an integral-type heterodyne mixer has been devised in which a niobium plane-type weak-link Josephson junction is used at the local oscillator and mixer section ("Josephson Triode", in DENSHI TSUSHIN GAKKAI RONBUNSHI (Journal of Electron Transmission Society) '86/5, Vol. J69-C, p. 639; DENSI JOUHO TSUSHIN GAKKAI-SHI, '87/5 SCE 87-9, p. 49). This Josephson triode is of integral type, and hence can make the apparatus greatly compact.

FIG. 11A schematically illustrates a constitution of the above Josephson triode, numeral 1 designates a converter terminal, 2 designates an ocsillator terminal, 3 designates a common ground. FIG. 11B illustrates an equivalent circuit thereof. Among three weak-link Josephson junctions JJ1, JJ2 and JJ3, JJ1 is used as a converter for heterodyne detection, JJ2, as an oscillator for local oscillation, and JJ3, as an isolator for separating JJ1 from JJ2. The device is operated by applying a bias current to JJ2 to cause local oscillation attributable to the AC Josephson effect, and mixing the signals resulting from this local oscillation and an externally originating electromagnetic wave in the JJ1 serving as the converter so that an intermediate frequency signal is obtained.

In the above Josephson triode, however, it is necessary to set the characteristics of normal resistance $Rn_{13}$, $Rn_{12}$, $Rn_{23}$, etc. of the several Josephson junctions each at a proper valve. In the conventional Josephson junction of a weak-link type of junction employing a material such as Nb, however, it is difficult to control the characteristics at the time of manufacture. Hence, the above Josephson triode can be manufactured with great difficulty.

Moreover, the above conventional apparatus or device employs the material such as Nb, having a low critical temperature Tc (around the liquid helium temperature), so that the device must be made to operate at a low temperature, requiring a very large-scale cooling apparatus in which the Joule-Thomson effect is utilized. In addition, the maximum frequency that can be used is as low as about 1 THz, and hence the recent demand of providing a high-frequency band mixer has not been completely satisfied.

SUMMARY OF THE INVENTION

On account of the problems involved in the above prior art, an object of the present invention is to make it possible to realize an integral-type electromagnetic wave mixer capable of being prepared with a good reproducibility, having a very simple structure, and employing an oxide superconductor.

The present invention provides a superconductive electromagnetic-wave mixer comprising a local-oscillator source and a receiving section, said receiving section serving as a section at which an electromagnetic wave from the local-oscillator source and an externally originating electromagnetic wave are combined; wherein said local-oscillator source and said receiving section are formed by at least one Josephson junction employing at least one oxide superconductor, respectively.

In another embodiment, the present invention provides a superconductive electromagnetic wave mixer comprising a local-oscillator source and a receiving section, said receiving section serving as a section at which an electromagnetic wave from the local-oscillator source and an externally originating electromagnetic wave are combined; wherein said local-oscillator source and said receiving section are formed by at least one Josephson junction employing at least one oxide superconductor, respectively, and said local-oscillator source and said receiving section are coupled through a conductive material.

The present invention also provides a superconductive electromagnetic-wave mixing apparatus comprising:

a superconductive electromagnetic wave mixer comprising a local-oscillator source, and a receiving section at which an electromagnetic wave from said local-oscillator source and an externally originating electromagnetic wave are combined, said local-oscillator source and said receiving section being formed by at least one Josephson junction employing at least one oxide superconductor, respectively;

an introducing means through which the externally originating electromagnetic wave is introduced into the receiving section of said electromagnetic wave mixer;

an amplifier that amplifies the electromagnetic wave of an intermediate frequency band, obtained as a result of the mixing in said electromagnetic wave mixer; and a cooler that cools at least said electromagnetic wave mixer.

DETAILED DESCRIPTION OF THE PREFERRED EMBODIMENTS

The superconductive electromagnetic wave mixer of the present invention will be described below using schematic illustrations of its structure.

In the first embodiment of the superconductive electromagnetic wave mixer of the present invention, a plurality of Josephson junction regions comprised of crystal grain boundaries of an oxide superconductor thin film are coupled interposing an insulating layer between them. In its operation, a bias voltage is applied to a Josephson junction region used as the local-oscillator section (source) among the above plurality of Josephson junction regions so that a local oscillator signal is generated. This local-oscillator signal and the externally originating electromagnetic wave are combined (or undergo mixing) at the Josephson junction region used as the receiving section among the above plurality of Josephson Junction regions, and the intermediate frequency signal is thus taken out.

Figure 1A:
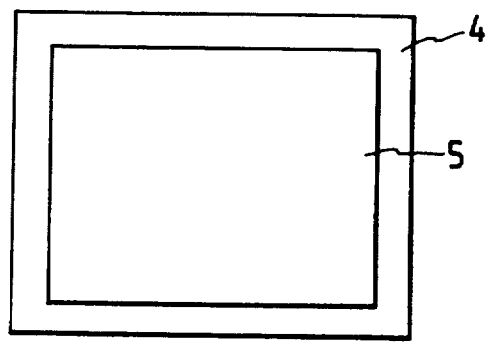
FIGS. 1A to 1D schematically illustrate a process for preparing a superconductive electromagnetic wave mixer according to an embodiment of the present invention.
Figure 1B:
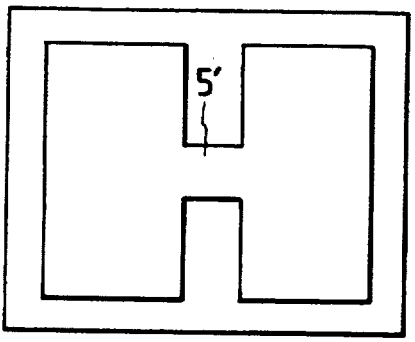

Description will be specifically made with reference to the drawings. The first embodiment of the superconductive electromagnetic-wave mixer of the present invention is roughly grouped into a plane type as shown in FIGS. 1C and 1D, a laminate type as shown in FIGS. 2D and 2E, and also a multiple type as shown in FIGS. 3A and 3B.

Figure 1C:
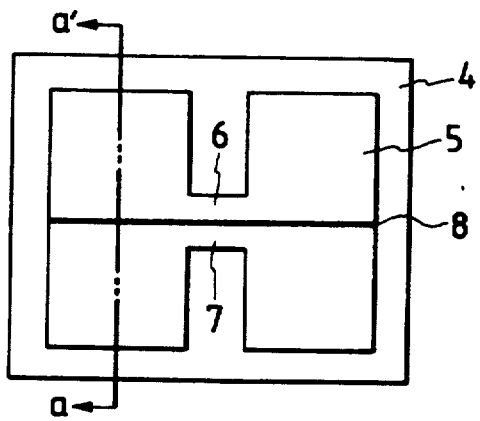
Figure 1D:
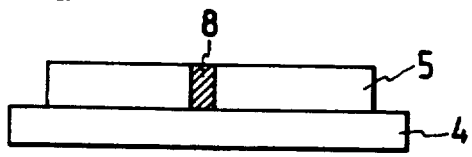
Figure 2A:
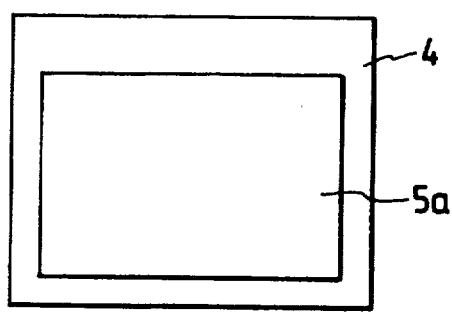
FIGS. 2A to 2E show an other process corresponding to FIGS. 1A to 1D.
Figure 2B:
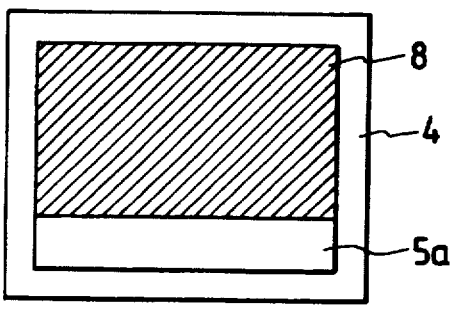
Figure 2C:
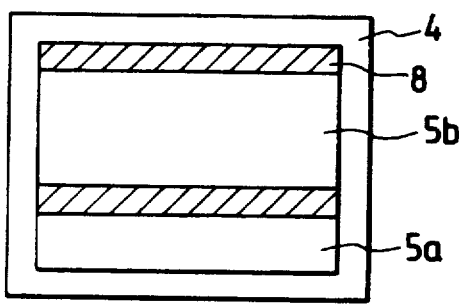

Firstly, FIGS. 1C (a plan view) and 1D (a cross section along the line a—a' in FIG. 1C) illustrate a plane-type superconductive electromagnetic wave mixer, in which on the substrate 4 two Josephson junction regions 6 and 7 comprised of crystal grain boundaries of the oxide superconductor thin film 5, which regions serve as the local-oscillator section and the receiving section, respectively, and in which these local-oscillator section and receiving section are laterally arranged interposing the insulating material 8 between them.

This plane type superconductive electromagnetic wave mixer can be prepared by a method comprising depositing one layer of the oxide superconductor thin film 5 of a polycrystalline on the substrate 4, followed by patterning using a technique such as photolithography or ion implantation, and then bringing the two Josephson junction regions 6 and 7 into a very close plane arrangement interposing the insulating material 8 between them.

Figure 2D:
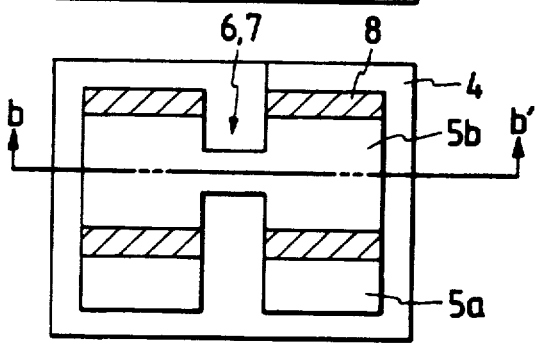
Figure 2E:
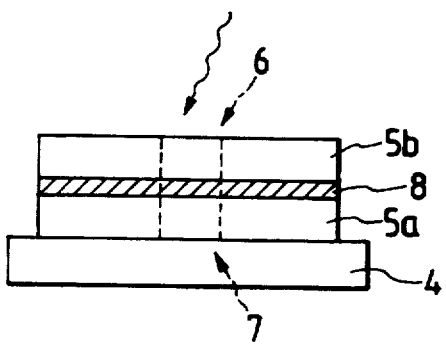
Figure 3A:
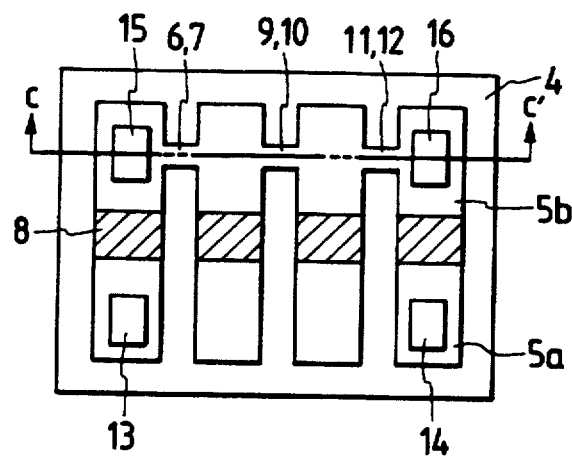
FIGS. 3A and 3B schematically illustrate another embodiment of the present invention.
Figure 3B:
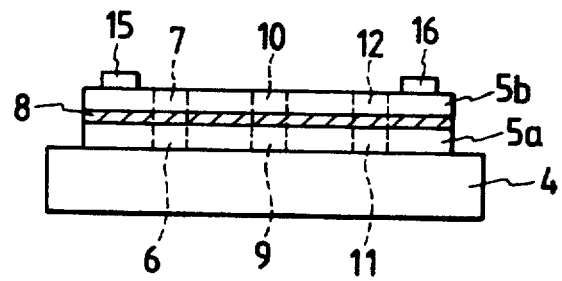

Secondly, FIGS. 2D (a plan view) and 2E (a cross section along the line b—b' in FIG. 2D) illustrate a laminate type superconductive electromagnetic wave mixer, in which on the substrate 4 two Josephson junction regions 6 and 7 comprised of crystal grain boundaries of the lower and upper films 5a and 5b, are laminated interposing the insulating material 8 between them, and the regions 6 and 7 serve as the local-oscillator section and the receiving section, respectively.

This laminate type superconductive electromagnetic wave mixer can be prepared by a method comprising depositing on the substrate 4 the lower film 5a, the insulating material 8 and the upper film 5b in this order, followed by patterning using a technique such as photolithography, thus, the two Josephson junction regions 6 and 7 can be arranged close each other interposing the insulating material 8 between them.

Thirdly, FIGS. 3A (a plan view) and 3B (a cross section along the line c—c' in FIG. 3A) illustrate a multiple type superconductive electromagnetic wave mixer, in which on the substrate 4 the lower and upper films 5a and 5b are laminated interposing the insulating material 8 between them, and the Josephson junction regions 6, 9 and 11 serving as local-oscillator sections and Josephson junction regions 7, 10 and 12 serving as receiving sections are formed interposing the insulating material 8, and further the electrodes 13, 14 and 15, 16 are formed.

The multiple type mixer specifically refers to a superconductive electromagnetic wave mixer of the type in which the respective local-oscillator sections and receiving sections are contained in a plural number. This multiple type superconductive electromagnetic wave mixer can be prepared by the same method as the method of preparing the above laminate type superconductive electromagnetic wave mixer, except that a larger number of Josephson junctions are formed by patterning.

Though not shown in the drawings, it is also possible in the plane type superconductive electromagnetic wave mixer previously described to respectively form the local-oscillator section and receiving section into multiplicity. Needless to say, such a plane type multiple superconductive electromagnetic wave mixer is also embraced in the first embodiment of the present invention.

In the above embodiment, the Josephson junction region comprised of crystal grain boundaries of an oxide superconductor thin film is used. Any preparation method, material and form may be employed so long as the polycrystalline thin film of an oxide superconductor is used. The insulating material through which the two Josephson junction regions are coupled together may be made of any materials, by any method and in any form, including insulating thin films comprising MgO, YSZ (yttrium stabilized zirconia) or a polymer of an organic substance, those obtained by making an oxide superconductor into an insulating material by means of ion implantation or the like, or gaps or level differences formed by means of etching or the like, where substantially the same effect can be obtained.

In a second embodiment of the superconductive electromagnetic wave mixer of the present invention, a plurality of Josephson junction regions comprised of crystal grain boundaries of an oxide superconductor thin film are coupled through a conductive material between them. Its operation is same as in the above first embodiment.

Description will be specifically made with reference to the drawings. The second embodiment of the superconductive electromagnetic wave mixer of the present invention is roughly grouped into a plane type as shown in FIGS. 4C and 4D, and a multiple type as shown in FIG. 5.

Figure 4A:
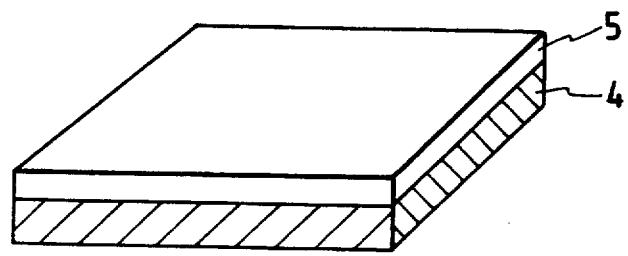
FIGS. 4A to 4D schematically illustrate another process for preparing a superconductive electromagnetic wave mixer according to another embodiment of the present invention.
Figure 4B:
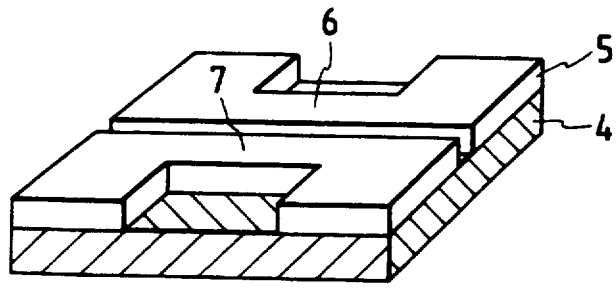
Figure 4C:
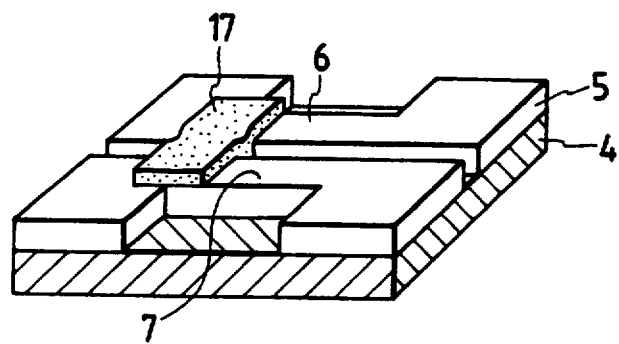
Figure 4D:
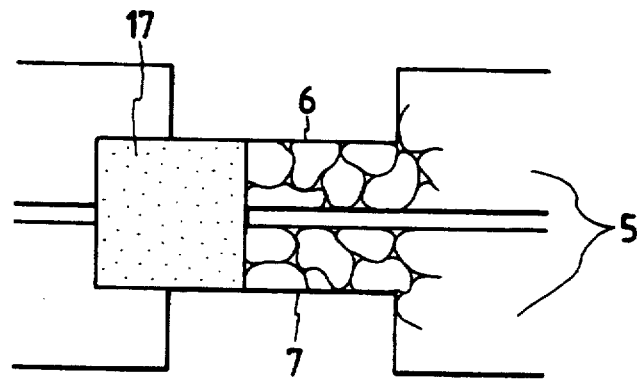

Firstly, FIGS. 4C and 4D (4D: a plan view of FIG. 4C) illustrate a plane type superconductive electromagnetic wave mixer, in which on the substrate 4 two Josephson junction regions 6 and 7 of a plane-type or quasi-plane-type comprised of crystal grain boundaries of the oxide superconductor thin film 5, one region of which serves as the local-oscillator section and also the other region of which serves as the receiving section, are provided, and the above two Josephson junction regions 6 and 7 are coupled using the conductive material 17.

The superconductive electromagnetic wave mixer according to the present embodiment can be prepared, for example, in the following manner: First, on the substrate 4 made of MgO or the like, the superconductive thin film 5 is formed (FIG. 4A). Next, patterning is carried out by photolithography or the like to form two Josephson junction regions 6 and 7 (FIG. 4B). Then, the conductive material 17 taking the form of extending over the two Josephson junction regions is formed (FIG. 4C).

Figure 5:
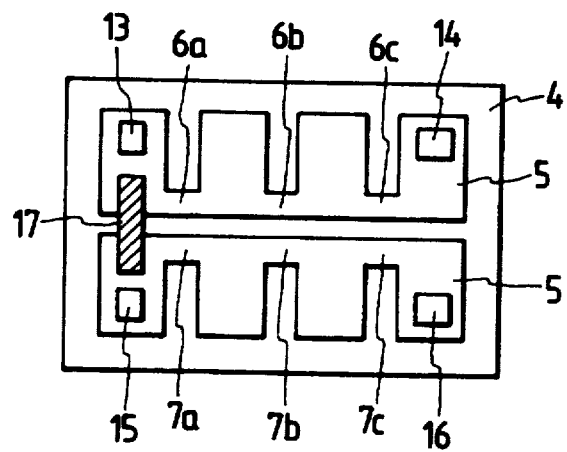
FIG. 5 schematically illustrates an other embodiment of the present invention.

Secondly, FIG. 5 illustrates a multiple type superconductive electromagnetic wave mixer, in which on the substrate 4 the oxide superconductor thin film 5, which is subjected to patterning to form Josephson junction regions 6a, 6b and 6c serving as local-oscillator sections and Josephson junction regions 7a, 7b and 7c serving as receiving sections, are provided and the local-oscillator sections and the receiving sections being coupled through the conductive material 17, and electrodes 13, 14 and 15, 16 being further formed. This multiple type superconductive electromagnetic wave mixer can be prepared by the same method as the method of preparing the above plane type (or quasi-plane type) superconductive electromagnetic wave mixer, except that a larger number of Josephson junctions are formed by patterning.

In the above embodiment, the Josephson junction region comprised of crystal grain boundaries of an oxide superconductor thin film is used. Any preparation method, material and form may be employed so long as the polycrystalline thin film of an oxide superconductor is used.

The conductive material through which the local-oscillator sections and receiving sections are coupled together may be made by any method and of any materials so long as it is a conductive material such as a metal, a semiconductor, or a superconductor.

In the third embodiment of the superconductive electromagnetic wave mixer of the present invention, it comprises a local-oscillator section and a receiving section constituted of a tunneling Josephson junction using an oxide superconductor thin film, respectively, and said local-oscillator section and receiving section being coupled by any of Josephson junction, capacitance, resistance and inductance formed of a conductive material or insulating material.

Figure 6A:
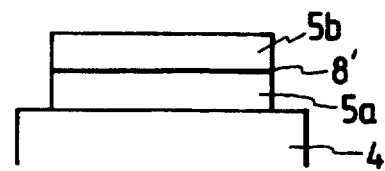
FIGS. 6A to 6C schematically illustrate a superconductive electromagnetic wave mixer according to still another embodiment of the present invention.
Figure 6B:
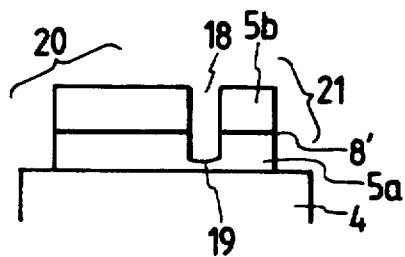
Figure 6C:
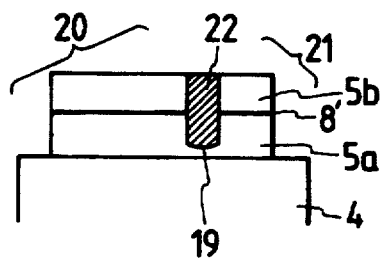

FIGS. 6A to 6C schematically illustrate an example of the structure of the superconductive electromagnetic wave mixer according to the present embodiment, and a preparation method therefor.

First, on the substrate 4 made of, for example, MgO, the lower film 5a is formed, the insulating material layer 8' is formed thereon, and the upper film 5b is further formed thereon (FIG. 6A). Next, patterning is carried out by photolithography or the like to form the groove 18 (FIG. 6B). Here, superconductive properties change at the bottom (coupling part 19) of the groove as a result of processing as exemplified by ion milling, and the desired characteristics of any of the insulating material and the conductive material can be obtained. The conductive material herein mentioned includes even semiconductors and superconductors. This utilizes the property that the characteristics of oxide superconductors are very sensitively governed by compositional ratios. A pair of tunneling Josephson junction regions having Josephson current values suited to the local-oscillator section and receiving section can also be formed by changing right and left extent of the groove 18. Here, the groove 18 need not be physically cut so long as the groove is capable of changing the degree of the coupling of the right and left Josephson junction regions, and may be formed by ion implantation or the like as shown in FIG. 6C. In the device as shown in FIGS. 6A to 6C, a bias current is applied to the left-side Josephson junction region 20 to generate a local-oscillator signal, and the signal is introduced into the right-side Josephson junction region 21, where the mixing with the electromagnetic wave irradiated from the outside is carried out to achieve heterodyne detection. In FIGS. 6A to 6C an example is shown in which the device is processed after lamination, but the preparation method is not limited to this.

In the respective embodiments, in order for the device to operate as an electromagnetic-wave mixer, the relationship $I_1 > I_2 > I_3$ is required to be established between the value $I_1$ for the Josephson current flowing through the Josephson junction region that forms the local-oscillator section, the value $I_2$ for the Josephson current flowing through the Josephson junction region that forms the receiving section, and the value $I_3$ for the isolator current that may flow between the above local-oscillator section and receiving section.

Figure 1E:
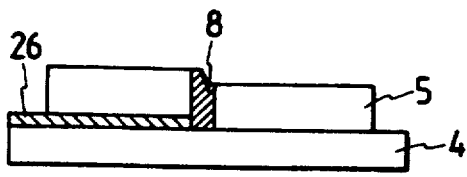
FIG. 1E schematically illustrates another embodiment of the present invention.

For the achievement of the unbalance between these current values, it is possible to use, in the first embodiment, a method in which, for example, the widths of the Josephson junction regions 6 and 7 as shown in FIG. 1C are made different (the width of the local-oscillator section > the width of the receiving section), or the film 26 such as an MgO thin film, a $ZrO_2$ thin film or an Ag thin film is deposited only beneath the receiving section so that the superconductivity may be changed at its upper part (see FIG. 1E). This method is preferred because the respective Josephson current values can be readily controlled only by variously selecting the materials or changing conditions for film formation. A similar method is possible also in the second embodiment. In the third embodiment, it is possible to use a method in which, for example, the Josephson junction regions 20 and 21 as shown in FIGS. 6B and 6C are coupled to give a junction unbalanced in its extent.

Materials that can be used for the above film include, for example, the following:

Ag, Au, Nb, NbN, Pb, Pb-Bi,

MgO, $ZrO_2$, $SiO_x$, a-Si , and other oxides.

In the case that Josephson current may be increased by the above methods for controlling Josephson current , the Josephson junction serves as the local oscillation section, while in the case that Josephson current may be decreased by the above methods, the Josephson junction serves as the receiving section.

The superconductor that constitutes the oxide superconductor thin film in the respect ire embodiments described above, when represented by the formula A-B-C-D, it is desirable that A is at least one element selected from the group consisting of La, Ce, Pt, Nd, Pm, Sm, Eu, Gd, Tb, Dy, Ho, Er, Tm, Yb, Lu, Sc , Y, and Bi; B is at least one element selected from the group consisting of Ca, Sr, Ba, and Pb; C is at least one element selected from the group consisting of V, Ti, Cr, Mn, Fe, Ni, Co, Ag, Cd, Cu, Zn, Hg, and Ru; and D is O.

More specifically, it includes;

(1) 214 type:

$(La_{1-x}M_x)_2CuO_{4-\delta}$ (M=Na, Ca, Sr, Ba)

(Ln, Sr, Ce)$_2CuO_{4-\delta}$ (Ln=a lanthanoid such as Nd)

(Ln, Ce)$_2CuO_{4-\delta}$ (Ln=a lanthanoid such as Pr or Nd)

(2) 123 type:

$Ln(Ba_2Cu_3O_{7-\delta}$ (Ln=any sort of lanthanoids), and those wherein Ln has been substituted with any sort of elements)

(3) Bi base:

$Bi_2Sr_2CuO_y$, $Bi_2Sr_{2-x}Ln_xCuO_y$, $Bi_2Sr_2CaCu_2O_y$, $Bi_2Sr_{3-x}Ln_xCu_2O_y$, $Bi_{2-x}Pb_xSr_2Ca_2Cu_3O_y$, $Bi_2Sr(LnCe)_2Cu_2O_y$.

(In the above, Ln=any sort of lanthanoids), (4) base:

$Tl_2Ba_2Ca_nCu_{1+n}O_y$ (n=0, 1, 2, 3 . . . ), $TlBa_2Ca_nCu_{1+n}O_y$ (n=0, 1, 2, 3 . . . ).

(5) Pb base:

$Pb_2Sr_2Ca_{1-x}Ln_xCu_3O_y$ (x=about 0.5)

(6) 223 type:

$(LnBa)_2(LnCe)_2Cu_3O_y$ (Ln: a lanthanoid).

Use of materials having a critical temperature of not less than 77 K as exemplified by Y-Ba-Cu-O-based, Bi-Sr-Ca-Cu-O-based or Tl-Ba-Ca-Cu-O-based superconductors may also make it possible to use inexpensive liquid nitrogen as a refrigerant. When the mixer is continuously driven, it is possible to use a compact and inexpensive cryostat having no Joule-Thomson valve, thus bringing about an effective Josephson triode as the mixer of an integral type. When the materials of the above types are used, the energy gap 2 Δ is several 10 meV, which is larger by one figure than that of niobium. This means that the maximum frequency that can be used in a mixer extends up to about 10 THz, which is higher by one order of magnitude than that of niobium (about 1 THz).

The superconductive materials constituting the local-oscillator section and the receiving section may be composed of plural materials, respectively.

A mixing apparatus employing the superconductive electromagnetic wave mixer described above will be described below.

The superconductive electromagnetic wave mixing apparatus of the present invention comprises:

a superconductive electromagnetic wave mixer comprising a local-oscillator section, and a receiving section at which an electromagnetic wave from said local-oscillator section and an externally originating electromagnetic wave are combined, said local-oscillator section and said receiving section being formed by at least one Josephson junction employing at least one oxide superconductor, respectively;

an introducing means through which the externally originating electromagnetic wave is introduced into the receiving section of said electromagnetic wave mixer;

an amplifier that amplifies the electromagnetic wave of an intermediate frequency band, obtained as a result of the mixing in said electromagnetic wave mixer; and a cooler that cools at least said electromagnetic wave mixer.

Figure 12:
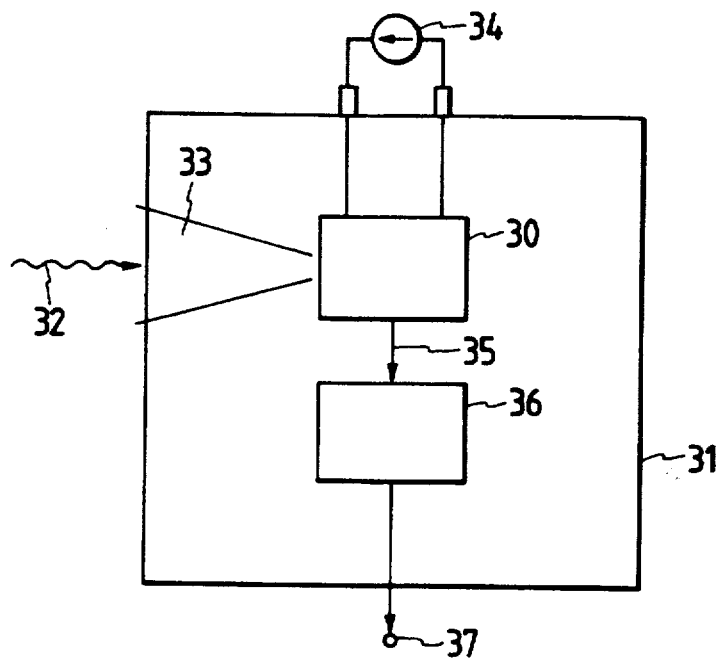
FIG. 12 schematically illustrates an embodiment of a mixing apparatus employing the superconductive electromagnetic wave mixer of the present invention.

The apparatus will be detailed below with reference to the drawings. First, as FIG. 12 shows, the above superconductive electromagnetic wave mixer, designated as 30, is installed in the cooler 31, such as cryostat and the externally originating electromagnetic wave 32 is introduced into the superconductive electromagnetic wave mixer 30 through the introducing means 33 for the externally originating electromagnetic wave 32, comprising a waveguide, a horn type antenna, etc. A bias current is also fed from the direct-current electric source 34 outside the cooler to the local-oscillator section of the superconductive electromagnetic wave mixer 30 to cause oscillation with a desired frequency. The externally originating electromagnetic wave 32 and the local-oscillator wave are combined (or caused to undergo mixing) to give the electromagnetic wave 35 of an intermediate frequency band (IF). This IF wave 35 is amplified using an amplifier 36, so that the output 37 after heterodyne mixing can be obtained.

In FIG. 12, the introducing means 33 and the amplifier 36 are provided inside the cooler 31, but, without limitation thereto, at least the superconductive electromagnetic wave mixer 30 may be cooled in the cooler 31.

Figure 13:
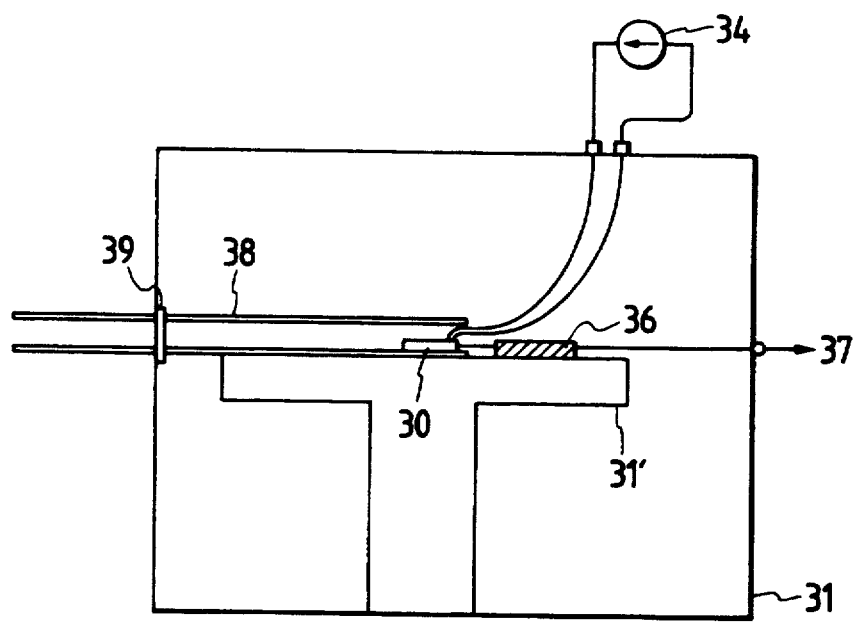
FIG. 13 schematically illustrates another embodiment of the mixing apparatus employing the superconductive electromagnetic wave mixer of the present invention.

In the superconductive electromagnetic wave mixing apparatus of the present invention, a preferred embodiment is the embodiment as shown in FIG. 13, in which the waveguide 38 is used as the introducing means and the superconductive electromagnetic wave mixer 30 is provided inside such the waveguide 38. This embodiment, in which the superconductive electromagnetic wave mixer having even the local-oscillator section inside the waveguide is provided, enables generation of local-oscillator waves within the same closed space as that for the introducing means for the externally originating electromagnetic wave; so that the mixing efficiency increases, in other words, the efficiency of the propagation of electromagnetic waves to the receiving section increases. It is also more preferable that the power of local-oscillator outputs can be decreased, which is accompanied with a decrease in the inflow of heat due to the Joule heat, so that not only the device itself can be made compact with its advantages well exhibited, but also the whole apparatus including the cooler can be made to operate with a low power dissipation and made compact.

The superconductive electromagnetic wave mixer of the present invention is equipped with both the local-oscillator section and the heterodyne mixer section in the same device, compared with the prior art heterodyne detectors as previously discussed. Thus, it became unnecessary to provide an external local oscillator and a waveguide for making connection thereto, and also it became possible to make the mixing apparatus very compact. In addition, the use of the external local oscillator has always required a local-oscillator output of from 10 nW to 100 nW, but the device according to the present invention requires that of only from 0.1 nW to 1 nW, having made it possible to greatly decrease the power dissipation.

According to the present invention, it is further possible to prepare an electromagnetic wave mixer that can operate at a relatively high temperature (around the liquid nitrogen temperature), using the oxide superconductor having a relatively high critical temperature Tc. Thus, it has become possible to construct a compact and inexpensive system with a simplified cooling unit.

Moreover, the mixer of the present invention has made it possible to be used as a device for high frequency bands, probably because it employs the oxide superconductor having a larger band gap than that of Nb or the like (the energy gap of Nb is about 3 meV, but that of the oxide superconductor as exemplified by a Y-based superconductor is larger than it by one figure). More specifically, a possible frequency limit was found to be about 700 GHz in the case of Nb, and about 10 THz in the case of Y-based superconductors. This further means that the information transmission speed is 10 times and the band width is also 10 times, namely, the information that can be transmitted in the same time increases by nearly two figures.

It has also become possible to successfully couple the local-oscillator section and the receiving section by virtue of the oxide superconductor having the property that the electrical characteristics may greatly change depending on the compositional changes. It has further become easy to obtain the desired Josephson current values because of the junction made to comprise the tunneling Josephson junction. The foregoing has made it possible to prepare a Josephson triode in a good yield.

It is more preferable to couple the local-oscillator section and receiving section of the mixer through an insulating material or a conductive material, than to form a gap between them. More specifically, it was found that, also when they were coupled through an insulating material, the dielectric constant of the insulating material was larger than $\epsilon_0$ of vacuum by about one order of magnitude, the electric capacity held between the local-oscillator section and receiving section was also larger than the case when the gap was formed between them, and thus the couple between the two sections was considered to have become stronger, bringing about, however, an increase in the mixing efficiency (i.e., the efficiency of the propagation of electromagnetic waves from the local-oscillator section). This further resulted in a still stronger couple when an insulating material was replaced with a conductive material, and hence a greater improvement was seen in the mixing efficiency.

A Josephson Junction of a grain boundary type is of weak-link type, which is more preferable than a tunneling Josephson junction with respect to the maximum frequency used and a mixing efficiency. This is also preferable in the sense of well making the most of the advantage resulting from the employment of the high-temperature oxide superconductor that can be applied to high-frequency bands, as previously mentioned.

The Josephson junction region that constitutes the local-oscillator section may be made plural in number, whereby the voltage to be applied to the local-oscillator section can be made larger and thus the local-oscillator frequency can be made stabler.

The Josephson junction region that constitutes the receiving section may also be made plural in number, whereby the detection efficiency can be improved.

EXAMPLES

The present invention will be described below in greater detail by giving Examples.

EXAMPLE 1

FIGS. 2A to 2D schematically illustrate the structure of, and preparation steps for, a superconductive electromagnetic wave mixer according to an embodiment of the present invention.

In the steps as shown in FIGS. 2A to 2B, the lower film 5a of $Y_1Ba_2Cu_3O_{7-x}$ (x=0 to 0.5) was formed on the substrate 4 by the cluster ion beam method (FIG. 2A). An $SrTiO_3$ monocrystalline substrate was used as the substrate 4. This film formation was carried out under conditions as follows: y, BaO and Cu were used as evaporation sources, the acceleration voltage and ionization current therefor were 1 kV and 300 mA, respectively, for each element, the substrate temperature was set to 500° C., and oxygen gas was introduced at $1\times10^{-3}$ Torr at the time of deposition. The lower film 5a was comprised of a polycrystalline film with a film thickness of 0.1 μm, having crystal grains with a size of about 1 μm, and its resistance turned zero at a temperature of not more than 83 K.

Next, an MgO thin film was formed by deposition by RF sputtering method to form the insulating material 8 (FIG. 2B). This film formation was made under conditions as follows: Using an MgO target, in a sputtering gas of $Ar:O_2=1:1$ under $1\times10^{-2}$ Torr, the substrate temperature was set to 200° C., and the sputtering power, to 200 W. The resulting layer had a film thickness of 0.08 μm.

Subsequently, the upper film 5b was formed in the same manner as the lower film 5a (FIG. 2C). This upper film 5b showed zero resistance at a temperature of not more than 81 K.

Patterning was further carried out by photolithography to form two Josephson junction regions 6 and 7 in a laminate form (FIGS. 2D and 2E). The two Josephson junction regions 6 and 7 were each 2 μm in width and 3 μm in length.

The superconductive electromagnetic wave mixer thus prepared was cooled to 40 K by means of a simple cooling unit, and then a bias current was applied to the Josephson junction region 7 from a DC electric source to make it to the local-oscillator section, and an electromagnetic wave was irradiated on the Josephson junction 6 serving as the receiving section. As a result, the device satisfactorily operated as a mixer of electromagnetic waves in a frequency region of from 100 GHz to 1 THz.

In the present Example, devices obtained by replacing Y in the superconductive thin film material $Y_1Ba_2$-

$Cu_3O_{7-x}$ (x=0 to 0.5) with a lanthanoid such as Ho, Er, Yb, Eu or La also similarly operated.

EXAMPLE 2

FIGS. 1A to 1E illustrate preparation steps for a superconductive electromagnetic wave mixer according to an embodiment of the present invention. In the superconductive electromagnetic wave mixer shown in these FIGS. 1A to 1D, ion implantation by FIB was carried out to a superconductive thin film to make an insulating material.

First, on the substrate 4, the superconductive thin film 5 was formed (FIG. 1A). An MgO monocrystalline substrate was used as the substrate 4. As the superconductive thin film 5 used, a film, which was formed by RF magnetron sputtering, using a $Bi_2Sr_2Ca_2Cu_3O_{10}$ target under conditions of an Ar pressure of $1 \times 10^{-2}$ Torr, an RF power of 200 W and a substrate temperature of 100° C., and heating at 860° C. in the atmosphere after the film formation, was used. This superconductive thin film 5 was comprised of a polycrystalline film with a film thickness of 0.2 μm, having crystal grains with a size of from 2 to 3 μm, and exhibited superconductivity at a temperature of not more than 95 K.

Next, patterning was carried out by photolithography to form the narrow 5' in the superconductive thin film 5 (FIG. 1B). This narrow 5' was made to have a dimension of 5 μm in length and 8 μm in width.

Subsequently, along the center line of this narrow 5' Ar ions were further implanted by FIB in a width of 0.5 μm to form the insulating material 8. Thus, the narrow 5' was divided into two parts to form the Josephson junction regions 6 and 7 in a very close arrangement, and at the same time the superconductive thin film 5 was divided into two parts (FIG. 1C).

The superconductive electromagnetic wave mixer thus prepared operated like that in Example 1.

In the present Example, devices obtained by changing the superconductive thin film material to $Bi_{2-x}Pb_xSr_2Ca_2Cu_3O_{10}$ or replacing Bi thereof with lead also similarly operated.

EXAMPLE 3

FIG. 5 schematically illustrates the structure of a superconductive electromagnetic wave mixer according to an embodiment of the present invention. The superconductive electromagnetic wave mixer shown in FIG. 5 was prepared according to the following steps. First, using an MgO monocrystalline substrate as the substrate 4, the oxide superconductor thin film 5 was formed thereon. The oxide superconductor thin film 5 was formed by RF magnetron sputtering, using a $Bi_2Sr_2Ca_2Cu_3O_{10}$ target under conditions of a sputtering power of 150 W, a sputtering gas of Ar, gas pressure of $2 \times 10^{-3}$ Torr and a substrate temperature of 100° C. to give a film thickness of 0.25 μm, followed by heating at 860° C. in an atmosphere of 30% $O_2$ and 70% $N_2$. This thin film 5 turned to a polycrystalline film having crystal grains with a size of about 2 μm, and exhibited superconductivity at a temperature of not more than 95 K.

On this oxide superconductor thin film 5, patterning was carried out by photolithography to form Josephson junction regions 6a, 6b and 6c serving as the local-oscillator sections and Josephson junction regions 7a, 7b and 7c serving as the receiving sections, all of which were made to be 4 μm in both width and length.

Next, Cr and Au were deposited by resistance heating to give films of 0.01 μm and 0.05 μm, respectively, in thickness, thus forming the conductive material 17 and the electrodes 13, 14 and 15, 16.

The superconductive electromagnetic wave mixer thus prepared was cooled to 40 K using a simple cooling unit. As a result, it satisfactorily operated as a mixer of electromagnetic waves in a frequency region of from 100 GHz to 1 THz.

A voltage necessary for applying a bias current to the local-oscillator section was larger than that in Example 2 by three or four times, so a stable operation could be achieved.

In the present Example, devices obtained by changing the superconductive thin film material to $Tl_2Ba_2Ca_nCu_{1+n}O_y$ (n=1, 2 or 3) or $TlBa_2Ca_nCu_{1+n}O_y$ (n=1, 2 or 3) also similarly operated.

EXAMPLE 4

FIGS. 3A and 3B schematically illustrate the structure of a superconductive electromagnetic wave mixer according to another embodiment of the present invention. The superconductive electromagnetic wave mixer as shown in FIGS. 3A and 3B comprises the local-oscillator section and receiving section which are coupled interposing an insulating material so as to form capacitance. FIG. 3A is a plan view thereof, and FIG. 3B is a cross section along the line c—c' in FIG. 3A. This superconductive electromagnetic wave mixer was prepared by the steps as follows: First, using an $SrTiO_3$ monocrystalline substrate as the substrate 4, the lower film 5a was formed thereon. This lower film 5a was formed using the cluster ion beam method, and using Y, BaO and Cu as deposition sources to deposit them on the substrate so as to be Y:Ba:Cu=1:2:1.5. The acceleration voltage and ionization current therefor were 1 kV and 300 mA, respectively, for each element, and the deposition was carried out by introducing oxygen gas of $1 \times 10^{-3}$ Torr and setting the substrate temperature to 500° C. The lower film 5a was comprised of a polycrystalline film with a film thickness of 0.1 μm, having crystal grains with a size of about 1 μm, and exhibited superconductivity at a temperature of not more than 83 K.

Next, an MgO thin film was formed by deposition by RF sputtering to form the insulating material 8. This film formation was made under conditions as follows: Using an MgO target, in a sputtering gas of $Ar:O_2=1:1$ under $1 \times 10^{-2}$ Torr, the substrate temperature was set to 200° C., and the sputtering power, to 200 W. The resulting layer had a film thickness of 0.08 μm.

Subsequently, the upper film 5b was formed in the same manner as the lower film 5a. This upper film 5b exhibited superconductivity at a temperature of not more than 81 K.

These lower and upper films 5a and 5b were further subjected to patterning by photolithography to form Josephson Junction regions 6, 9 and 11 serving as the local-oscillator sections and Josephson junction regions 7, 10 and 12 serving as the receiving sections in a laminate form. Thereafter, Cr and Au were deposited by resistance heating in a laminate form to give films of 0.01 μm and 0.05 μm, respectively, in thickness, thus forming the electrodes 13, 14 and 15, 16.

The superconductive electromagnetic wave mixer thus prepared satisfactorily operated like that in Example 3.

In the present Example, a device obtained by changing the superconductive thin film material to $Nd_{1.85}Ce_{0.15}CuO_y$ also similarly operated. This material, however, had a Tc of about 25 K, and hence was used by cooling it to 20 K. Also in the case that the lower and upper films 5a and 5b were constituted by different materials, the mixer operated similarly.

EXAMPLE 5

In the steps as shown in FIG. 4, an MgO monocrystalline substrate was used as the substrate 4, and the superconductive thin film 5 of $Bi_2Sr_2Ca_2Cu_3O_x$ was formed on the substrate 4 by RF magnetron sputtering. This film formation was carried out under conditions as follows: In an atmosphere of $Ar:O_2 = 1:1$ and a pressure of $7\times10^{-3}$ Torr, using a $Bi_2Sr_2Ca_2Cu_3O_x$ sinter as a target, the film was formed at a sputtering power of 100 W and a substrate temperature of 200° C. and the film thus formed was then heated at 850° C. for 1 hour in an oxidizing atmosphere. The film had a thickness of 0.8 $\mu$m. This thin film was comprised of a polycrystalline thin film having crystal grains with a size of from 2 to 3 $\mu$m (FIG. 4A). Next, patterning was carried out by photolithography to form two Josephson junction regions 6 and 7 in a close arrangement. The junction regions each had a dimension of 8 $\mu$m in length and 4 $\mu$m in width, and the space between the two Josephson junction regions was 1 $\mu$m (FIG. 4B). Next, Ag was vacuum-deposited thereon by resistance heating to form a film of 0.5 $\mu$m thick, followed by patterning by photolithography to form the conductive material 17 (FIG. 4C). Here, the Josephson junction is comprised utilizing crystal grain boundaries (FIG. 4D).

The electromagnetic wave mixer thus prepared satisfactorily operated as a heterodyne mixer of electromagnetic waves in a frequency region of from 100 GHz to 1 THz.

In the present Example, a device obtained by changing the superconductive thin film material to $Pb_2Sr_2Ca_{0.5}Y_{0.5}Cu_3O_y$ also similarly operated.

EXAMPLE 6

Here will be described an instance in which, in the embodiment shown in FIG. 4, $SrTiO_3$ was used as the substrate, a YBaCuO-based material was used as a superconductive material, and cluster ion beam deposition was used as a method of forming a superconductive thin film. First, on the substrate 4, the superconductive thin film 5 of $Y_1Ba_2Cu_3O_{7-x}$ (x=0.1 to 0.4) was formed by cluster ion beam deposition. This film was formed under conditions as follows: Using Y, BaO and Cu as evaporation sources, the acceleration voltage and ionization current therefor were 2 kV and 100 mA, respectively, for Y, 4 kV and 200 mA for BaO, and 4 kV and 200 mA for Cu. The substrate temperature was set to 600° C., and $O_2$ gas of $1.3\times10^{-2}$ Torr was introduced at the time of deposition. The resulting film had a thickness of 0.5 $\mu$m. This thin film was comprised of a polycrystalline thin film having crystal grains with a size of about 2 $\mu$m, and exhibited superconductivity without heat treatment (FIG. 4A). Patterning was carried out thereon in the same manner as in Example 5 to form two Josephson Junction regions 6 and 7 (FIG. 4B). The conductive material 17 was further formed in the same manner (FIG. 4C).

The electromagnetic wave mixer thus prepared satisfactorily operated like that in Example 5.

EXAMPLE 7

FIGS. 10A to 10D illustrate another embodiment. This utilizes a level difference formed on the substrate, for the formation of the Josephson junction.

Figure 10A:
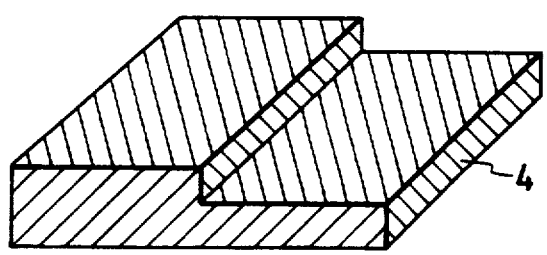
FIGS. 10A to 10D schematically illustrate a superconductive electromagnetic wave mixer according to an embodiment of the present invention.
Figure 10B:
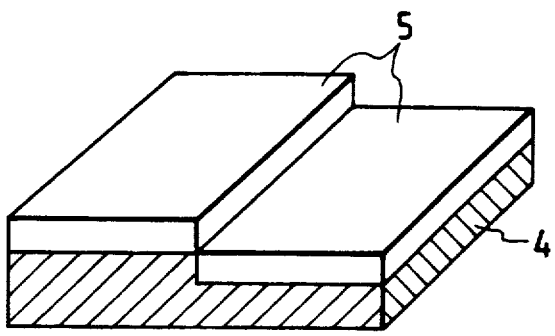
Figure 10C:
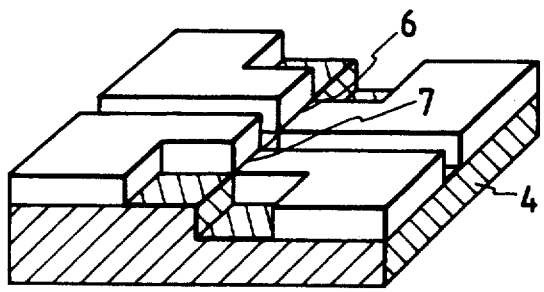
Figure 10D:
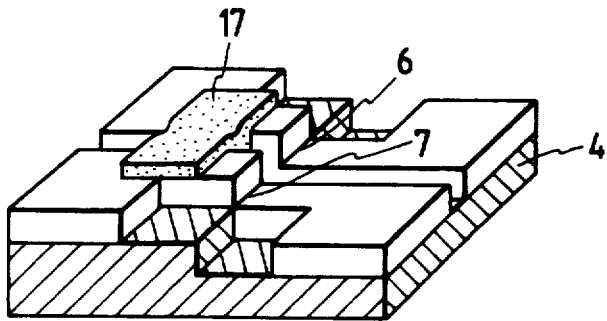

First, a level difference of 0.5 $\mu$m was formed by photolithography on the substrate 4 of an MgO monocrystalline (FIG. 10A). Next, on the substrate 4 on which the level difference was made, the superconductive thin film 5 of $Er_1Ba_2Cu_3O_{7-x}$ (x=0.1 to 0.4) was formed by RF magnetron sputtering. The film was formed under conditions as follows: In an atmosphere of an Ar gas pressure of $7\times10^{-3}$ Torr, using a $Er_1Ba_2Cu_3O_{7-x}$ (x=0.1 to 0.4) sinter as a target, the film was formed at a sputtering power of 150 W and a substrate temperature set to 100° C. and the film thus formed was then heated at 900° C. for 1 hour in an oxidizing atmosphere. The film had a thickness of 0.5 $\mu$m. This thin film was comprised of a polycrystalline thin film having crystal grains with a size of from 4 to 5 $\mu$m (FIG. 10B). Next, patterning was carried out in the same manner as in Example 5 to form two Josephson junction regions 6 and 7. However, the junction regions were each made to be 16 $\mu$m in length and 8 $\mu$m in width (FIG. 10C). The conductive material 17 was further formed in the same manner as in Example 5 (FIG. 10D).

The electromagnetic wave mixer thus prepared satisfactorily operated like that in Example 5.

EXAMPLE 8

In the steps as shown in FIG. 6, an MgO monocrystalline substrate was used as the substrate 4, and the lower film 5a of $Bi_2Sr_2Ca_2Cu_3O_x$ was formed on the substrate 4 by ion beam sputtering. This film formation was carried out, using a $Bi_2Sr_2Ca_2Cu_3O$ sinter as a target, under conditions of a background pressure of $2\times10^{-5}$ Torr, an Ar pressure of $3\times10^{-3}$ Torr, an ion current of 100 $\mu$A, an acceleration voltage of 7 kV, and a substrate temperature of 600° C. The resulting film had a thickness of 0.05 $\mu$m. Next, the insulating material layer 8' of MgO was formed by RF sputtering, using an MgO target, under conditions of an Ar pressure of $7\times10^{-3}$ Torr, a sputtering power of 100 W, and a substrate temperature of 150° C. Further thereon, the upper film 5b of $Bi_2Sr_2Ca_2Cu_3O$ was formed under the above conditions (FIG. 6A). Next, patterning was carried out by photolithography to form Josephson junction regions 20 and 21 as shown in FIG. 6B. Junction areas were 10 $\mu$m $\times$ 8 $\mu$m for the Josephson junction region 20 and 5 $\mu$m $\times$ 8 $\mu$m for the Josephson junction region 21. The groove 18 was 1 $\mu$m in width, and the film thickness at the coupling part 19 wa 0.15 $\mu$m.

At this time, current-voltage characteristics between the lower film 5a of the Josephson junction regions 20 and the lower film 5a of the Josephson junction 21 were measured at the liquid nitrogen temperature to reveal that the characteristics of a microbridge Josephson junction were exhibited. In other words, the coupling part 19 was made up of a weak-link Josephson junction. The Josephson current was found to be 80 $\mu$A.

The electromagnetic wave mixer thus prepared was set in a waveguide under liquid nitrogen cooling and evaluated. As a result, it satisfactorily operated as a heterodyne mixer of electromagnetic waves in a frequency region of from 100 GHz to 800 GHz.

EXAMPLE 9

Here will be described an instance in which, in the steps shown in FIG. 6, $SrTiO_3$ was used as the substrate 4, a YBaCuO-based material was used as the superconductive material, and the cluster ion beam deposition method was used for forming the superconductive thin film. First, on the substrate 4, the lower film 5a of YBa$_2$Cu$_3$O$_{7-x}$ (x=0.1 to 0.4) was formed by cluster ion beam deposition. This film was formed under conditions as follows: Using Y, BaO and Cu as evaporation sources, the acceleration voltage and ionization current therefor were 3 kV and 100 mA, respectively, for Y, 5 kV and 200 mA for BaO, and 5 kV and 200 mA for Cu. The substrate temperature was set to 700° C., and O$_2$ gas of 5×10$^{-3}$ Torr was introduced at the time of deposition. The resulting thin film was 0.06 μm thick. Next, Ag was deposited with a thickness of 0.002 μm by resistance heating, and ZrO$_2$ was formed thereon with a thickness of 0.001 μm by RF sputtering. At this time, YSZ was used as a target, the Ar pressure was 7×10$^{-3}$ Torr, the sputtering power was 100 W, and the substrate temperature was 100° C. The upper film 5b of YBaCuO of 0.08 μm thick was further formed thereon by the above cluster ion beam deposition at a substrate temperature set to 550° C. (FIG. 6A). Next, the Josephson junction regions 20 and 21 were formed by photolithography and cluster ion implantation (FIG. 6C). The ion implantation was carried out using Ar ions (5 keV). Junction areas were 12 μm ×10 μm for the Josephson junction region 20 and 6 μm ×10 μm for the Josephson junction region 21. The part at which the ions were implanted was 0.8 μm in width. The electric characteristics at the coupling part 19 were measured in the same manner as in Example 8, and were found to be semiconductive. The resistivity at the liquid nitrogen temperature was about 10$^3$ Ω.cm.

The electromagnetic wave mixer thus prepared satisfactorily operated at the liquid nitrogen temperature, like that in Example 8.

EXAMPLE 10

Figure 7A:
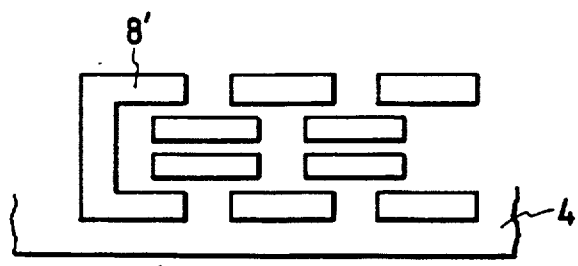
FIGS. 7A to 7E schematically illustrate a superconductive electromagnetic wave mixer according to an embodiment of the present invention.
Figure 7B:
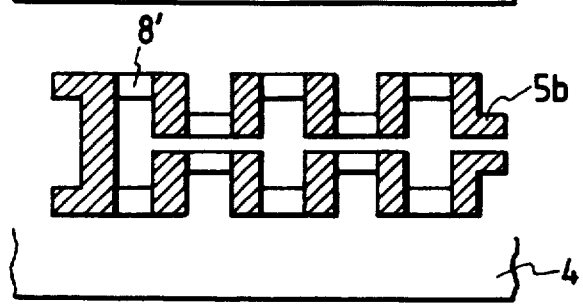
Figure 7C:
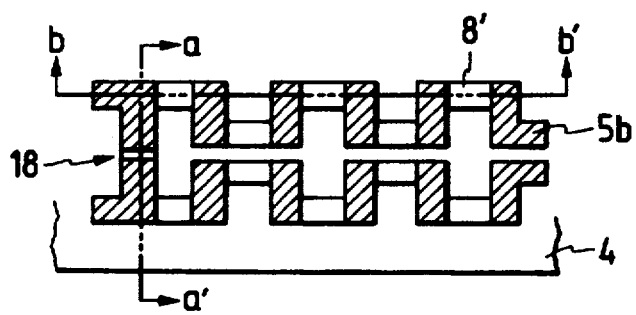
Figure 7D:
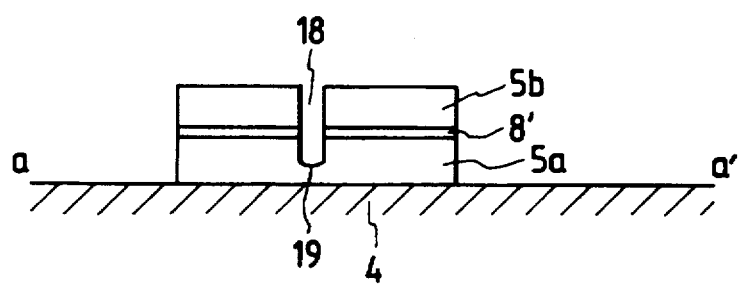
Figure 7E:
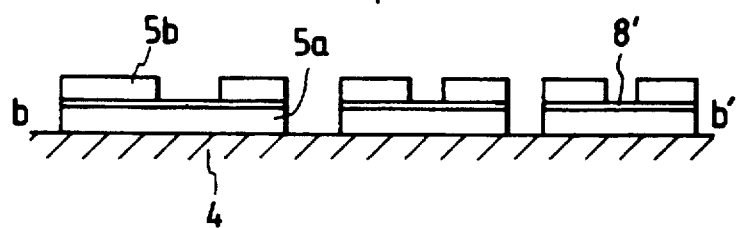

FIGS. 7A to 7D illustrate an electromagnetic wave mixer of Example 10. First, by the same process as in Example 9, the lower film 5a composed of a Y-based thin film of 0.06 μm thick and Ag of 0.002 μm thick and the insulating material layer 8' composed of ZrO$_2$ of 0.001 μm thick in this order was formed on the substrate 4, and patterning was carried out by photolithography (FIG. 7A). Next, the upper film 5b of Y-based thin film was formed thereon with a thickness of 0.06 μm, and patterning was carried out by photolithography to form a series array of tunneling Josephson junctions (FIG. 7B). Subsequently, using an excimer laser, the left-end junction was etched to form the groove 18 (FIG. 7C). FIGS. 7D and 7E show cross sections along the lines a—a' and b—b', respectively, in FIG. 7C. The groove 18 shown in FIG. 7C had a width of 0.5 μm. The electric characteristics at the coupling part 19 were measured in the same manner as in Example 8 to reveal that the resistivity was 10$^6$ Ω.cm or more and the electric capacitance was about 1 nF.

Figure 8:
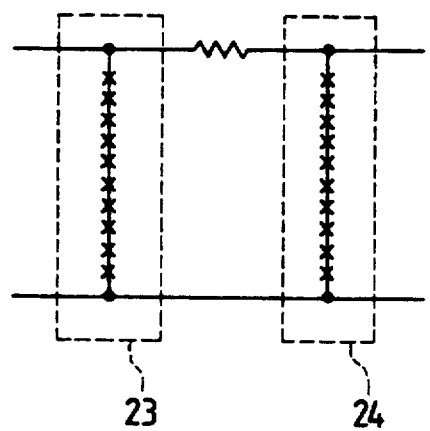
FIG. 8 schematically illustrates an equivalent circuit of the device shown in FIG. 7C.

FIG. 8 shows an equivalent circuit of this device.

Namely, both the local-oscillator section 23 and the receiving section 24 are set in 10 series arrays. This constitution makes it possible to make 10 times larger the operation voltage applied when the bias current is flowed to the local-oscillator section, and also makes 10 times larger the voltage at the receiving section. This can advantage the stability and noise resistance required when the device is actually operated.

The electromagnetic wave mixer thus prepared satisfactorily operated as a heterodyne mixer of electromagnetic waves in a region of from 100 GHz to 800 GHz at the liquid nitrogen temperature.

EXAMPLE 11

The procedure of Example 2 was repeated to form two Josephson Junction regions, one of which was made to have a width of 2 μm, the other of which a width of 5 μm, respectively, and both of which a length of 5 μm in common. Here, the Josephson current was 11 mA at the 2 μm wide Josephson junction region, which was used as the receiving section, and the Josephson current was 23 mA at the 5 μm wide Josephson junction region, which was used as the local-oscillator section.

As a result, the device satisfactorily operated like that in Example 2, but it was possible to take out the power of electromagnetic waves of intermediate frequencies at a higher level than that in Example 2.

EXAMPLE 12

Figure 9:
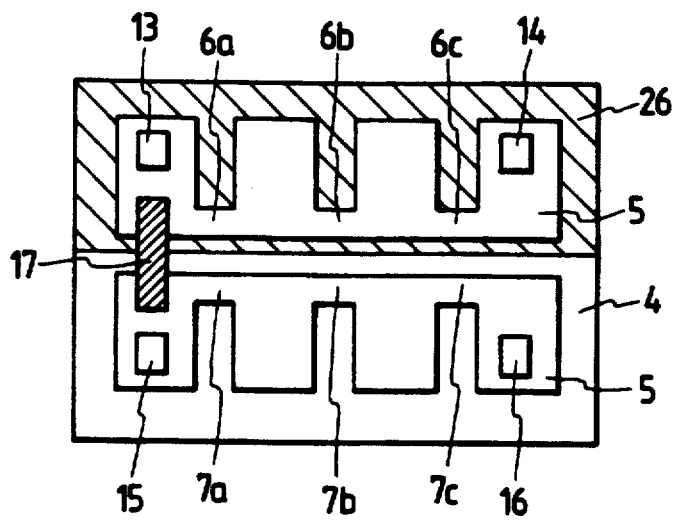
FIG. 9 schematically illustrates a superconductive electromagnetic wave mixer according to an embodiment of the present invention.
Figure 11A:
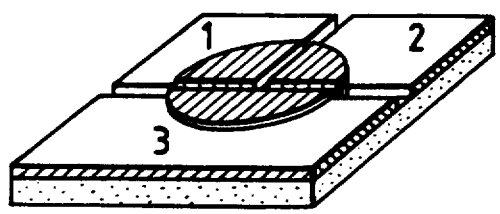
FIGS. 11A and 11B schematically illustrate a prior art Josephson triode.
Figure 11B:
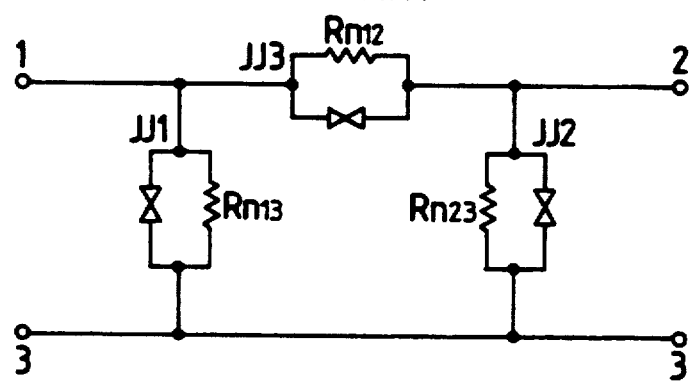

FIG. 9 schematically illustrates the structure of a superconductive electromagnetic wave mixer according to Example 12. The superconductive electromagnetic wave mixer shown in FIG. 9 was prepared according to the following steps.

First, an MgO monocrystalline substrate was used as the substrate 4. The thin film 26 of ZrO$_2$ was formed only half on the substrate with a thickness of only 0.002 μm. The film was formed by RF magnetron sputtering, using YSZ as a target, in a sputtering gas of Ar:O$_2$=1:1 and a pressure of 1×10$^{-2}$ Torr, at a substrate temperature of 200° C., and a power of 100 W. Thereafter, the procedure of Example 3 was repeated to form the local-oscillator section (7a, 7b and 7c) and the receiving section (6a, 6b and 6c). Here, the Josephson current at the local-oscillator section (7a, 7b and 7c) was 3.5 mA, and the Josephson current at the receiving section (6a, 6b and 6c) was 0.7 mA. The superconductive electromagnetic wave mixer thus prepared satisfactorily operated like that in Example 3, but it was possible to take out the power of electromagnetic waves of intermediate frequencies at a higher level than that in Example 3.

EXAMPLE 13

FIG. 13 illustrates the constitution of a mixing apparatus according to Example 13.

A superconductive electromagnetic wave mixer prepared by the method previously described in Example 1 was installed inside the rectangular waveguide 38 of 1 mm ×0.5 mm in inner size. This waveguide 38 was fixed on the cold head 31' of the cryostat 31 using a circulating helium gas and cooled to 15 K. Here, the waveguide 38 is partitioned with the Teflon sheet 39 of a 0.2 mm thick at the joining part thereof with the cryostat 31, so that the inside of the cryostat is kept vacuum. Under this constitution, using the direct current electric source 34 provided outside the cryostat, a bias current was fed to the local-oscillator section of the superconductive electromagnetic wave mixer described above. An electromagnetic wave of 200 GHz was introduced into the waveguide 38, using a gunn oscillator and a frequency doubler, and the bias current was applied at 15 to 39 mA. As a result, it was possible to obtain the mixing output 37 with an intermediate frequency of 1 to 0.7 GHz. Here, a GaAs FET amplifier was used as the amplifier 36.

We claim:

1. A superconductive electromagnetic wave mixer comprising a local-oscillator source located inside said mixer and a receiving section, said receiving section serving as a section at which an electromagnetic wave from the local-oscillator source and an externally originating electromagnetic wave are combined, wherein said local-oscillator source and said receiving section each comprises at least one Josephson junction employing at least one oxide superconductor.

2. The superconductive electromagnetic wave mixer according to claim 1, wherein said Josephson junction is a Josephson junction comprised of crystal grain boundaries of an oxide superconductor thin film.

3. The superconductive electromagnetic wave mixer according to claim 1, wherein said Josephson junction is a tunneling Josephson junction.

4. The superconductive electromagnetic wave mixer according to claim 1, comprising a plurality of said local-oscillator sources and of said receiving sections.

5. The superconductive electromagnetic wave mixer according to claim 1, wherein said local-oscillator source and said receiving section have a gap between them.

6. The superconductive electromagnetic wave mixer according to claim 1, wherein said local-oscillator source and said receiving section are coupled through an insulating material.

7. A superconductive electromagnetic wave mixer comprising a local-oscillator source located inside said mixer and a receiving section, said receiving section serving as a section at which an electromagnetic wave from the local-oscillator source and an externally originating electromagnetic wave are combined, wherein said local-oscillator source and said receiving section each comprise at least one Josephson junction employing at least one oxide superconductor, and said local-oscillator source and said receiving section are coupled through a conductive material.

8. The superconductive electromagnetic ave mixer according to claim 7, wherein said Josephson junction is a Josephson junction comprised of crystal grain boundaries of an oxide superconductor thin film.

9. The superconductive electromagnetic wave mixer according to claim 7, wherein said Josephson junction is a tunneling Josephson junction.

10. The superconductive electromagnetic wave mixer according to claim 7, comprising a plurality of said local-oscillator sources and of said receiving sections.

11. A superconductive electromagnetic wave mixing apparatus comprising:
a superconductive electromagnetic wave mixer comprising a local-oscillator source located inside said mixer, and a receiving section at which an electromagnetic wave from said local-oscillator source and an externally originating electromagnetic ave are combined, said local-oscillator source and said receiving section each comprising at least one Josephson junction employing at least one oxide superconductor;
an introducing means through which the externally originating electromagnetic wave is introduced into the receiving section of said electromagnetic wave mixer;
an amplifier that amplifies the electromagnetic wave of an intermediate frequency band, obtained as a result of the mixing in said electromagnetic wave mixer; and
a cooler that cools at least said electromagnetic wave mixer.

12. The superconductive electromagnetic wave mixing apparatus according to claim 11, wherein said Josephson junction is a Josephson junction comprised of crystal grain boundaries of an oxide superconductor thin film.

13. The superconductive electromagnetic wave mixing apparatus according to claim 11, wherein said Josephson junction is a tunneling Josephson junction.

14. The superconductive electromagnetic wave mixing apparatus according to claim 11, wherein said mixer comprises a plurality of said local-oscillator sources and of said receiving sections.

15. The superconductive electromagnetic wave mixing apparatus according to claim 11, wherein said local-oscillator source and said receiving section have a gap between them.

16. The superconductive electromagnetic wave mixing apparatus according to claim 11, wherein said local-oscillator source and said receiving section are coupled through an insulating material.

17. The superconductive electromagnetic wave mixing apparatus according to claim 11, wherein said local-oscillator source and said receiving section are coupled through a conductive material.

18. A superconductive electromagnetic wave mixer comprising a local-oscillator source located inside said mixer and a receiving section, said receiving section serving as a section at which an electromagnetic wave from the local-oscillator source and an externally originating electromagnetic wave are combined, wherein said local-oscillator source and said receiving section each comprises a Josephson Junction and said local-oscillator source and said receiving section are coupled through a junction member.

19. The superconductive electromagnetic wave mixer according to claim 18, wherein said junction member comprises a conductive material.

20. The superconductive electromagnetic wave mixer according to claim 18, wherein said junction member comprises an insulating material.

* * * * *

UNITED STATES PATENT AND TRADEMARK OFFICE
CERTIFICATE OF CORRECTION

PATENT NO. : 5,339,457
DATED : August 16, 1994
INVENTOR(S) : TAKEHIKO KAWASAKI, ET AL.

It is certified that error appears in the above-identified patent and that said Letters Patent is hereby corrected as shown below:

ON TITLE PAGE

In [56] References Cited, under OTHER PUBLICATIONS:
"$YBA_2Cu_3O_x$" should read --$YBa_2Cu_3O_x$--;
"superconductore"." should read --superconductors".--; and
"pp. 29≧35." should read --pp. 29-35.--.

COLUMN 2

Line 23, "electromagnetic-wave" should read
--electromagnetic wave--.

COLUMN 3

Line 3, "an other" should read --another--.
Line 11, "an other" should read --another--.
Line 59, "electromagnetic-wave" should read
--electromagnetic wave--.

COLUMN 7

Line 6, "film" should read --film 26--.
Line 17, "respect ire" should read --respective--.
Line 43, "base:" should read --Tl base:--.

COLUMN 8

Line 61, "increases," should read --increases;--.

COLUMN 12

Line 55, "Junction" should read --junction--.

UNITED STATES PATENT AND TRADEMARK OFFICE
CERTIFICATE OF CORRECTION

PATENT NO. : 5,339,457
DATED : August 16, 1994
INVENTOR(S) : TAKEHIKO KAWASAKI, ET AL.

It is certified that error appears in the above-identified patent and that said Letters Patent is hereby corrected as shown below:

COLUMN 14

Line 47, "wa 0.15 µm." should read --was 0.015 µm.--.

COLUMN 16

Line 4, "Junction" should read --junction--.
Line 58, "gunn" should read --Gunn--.

COLUMN 17

Line 35, "ave" should read --wave--.
Line 52, "ave" should read --wave--.

COLUMN 18

Line 44, "Junction" should read --junction.

Signed and Sealed this

Sixteenth Day of May, 1995

*Attest:*

BRUCE LEHMAN

*Attesting Officer*      *Commissioner of Patents and Trademarks*